US011289665B2

(12) United States Patent
Yang et al.

(10) Patent No.: US 11,289,665 B2
(45) Date of Patent: Mar. 29, 2022

(54) ORGANIC LIGHT-EMITTING DISPLAY SCREEN AND MANUFACTURING METHOD THEREOF

(71) Applicant: Visionox Technology Inc., Shantou (CN)

(72) Inventors: Xiaolong Yang, Kunshan (CN); Guizhou Qiao, Kunshan (CN); Rubo Xing, Kunshan (CN)

(73) Assignee: VISIONOX TECHNOLOGY INC., Shantou (CN)

( * ) Notice: Subject to any disclaimer, the term of this patent is extended or adjusted under 35 U.S.C. 154(b) by 489 days.

(21) Appl. No.: 16/336,643

(22) PCT Filed: Aug. 21, 2018

(86) PCT No.: PCT/CN2018/101472
§ 371 (c)(1),
(2) Date: Mar. 26, 2019

(87) PCT Pub. No.: WO2019/042188
PCT Pub. Date: Mar. 7, 2019

(65) Prior Publication Data
US 2021/0288272 A1 Sep. 16, 2021

(30) Foreign Application Priority Data
Aug. 31, 2017 (CN) .......................... 201710779094.0

(51) Int. Cl.
*H01L 51/00* (2006.01)
*H01L 27/32* (2006.01)
*H01L 51/52* (2006.01)
*H01L 51/56* (2006.01)

(52) U.S. Cl.
CPC ........ *H01L 51/0096* (2013.01); *H01L 27/322* (2013.01); *H01L 27/3253* (2013.01);
(Continued)

(58) Field of Classification Search
CPC . H01L 51/0096; H01L 51/5209; H01L 51/56; H01L 2227/323; H01L 2251/5353;
(Continued)

(56) References Cited

U.S. PATENT DOCUMENTS 5,929,474 A * 7/1999 Huang ................ H01L 27/3276
257/292
9,236,418 B2 * 1/2016 Yamazaki ........... H01L 51/5253
(Continued)

FOREIGN PATENT DOCUMENTS

CN         203085550 U    7/2013
CN         103268921 A    8/2013
(Continued)

OTHER PUBLICATIONS

International Search Report dated Nov. 26, 2018 in corresponding International application No. PCT/CN2018/101472; 5 pages.
(Continued)

*Primary Examiner* — Kyoung Lee
*Assistant Examiner* — Christina A Sylvia
(74) *Attorney, Agent, or Firm* — Maier & Maier, PLLC

(57) ABSTRACT

The disclosure provides an organic light-emitting display screen and a manufacturing method thereof. The organic light-emitting display screen includes a filter substrate, and further includes a color filter layer, a cathode layer, an organic light-emitting layer and an anode array sequentially formed on the filter substrate. The anode array includes a number of anode units spaced apart from each other, the color filter layer includes a number of filter units, and each of the anode units corresponds to each of the filter units.

15 Claims, 7 Drawing Sheets

(52) U.S. Cl.
CPC .......... *H01L 51/5209* (2013.01); *H01L 51/56* (2013.01); *H01L 2227/323* (2013.01); *H01L 2251/5353* (2013.01)

(58) Field of Classification Search
CPC ................. H01L 27/3232; H01L 27/3253; H01L 27/322
See application file for complete search history.

(56) References Cited

U.S. PATENT DOCUMENTS

2005/0179379 A1* 8/2005 Kim .................... H01L 51/5253 313/512
2014/0061597 A1* 3/2014 Choi ..................... G06F 3/0446 257/40
2019/0377223 A1* 12/2019 Lee ....................... H01L 27/322

FOREIGN PATENT DOCUMENTS

| CN | 103715147 A | 4/2014 |
|----|-------------|--------|
| CN | 104112764 A | 10/2014 |
| CN | 106098954 A | 11/2016 |
| CN | 107527941 A | 12/2017 |

OTHER PUBLICATIONS

Chinese Office Action dated Mar. 5, 2019 in connection with corresponding CN Application No. 201710779094.0; 14 pages.

* cited by examiner

ORGANIC LIGHT-EMITTING DISPLAY SCREEN AND MANUFACTURING METHOD THEREOF

FIELD OF THE DISCLOSURE

The disclosure relates to the field of display screen technology, and in particular to an organic light-emitting display screen and a manufacturing method thereof.

BACKGROUND

An organic light-emitting diode (OLED) microdisplay screen will be more and more commonly applied to head-mounted display devices such as AR and VR. At present, the OLED microdisplay screen is generally prepared by first processing a backplane drive circuit on a Si-based wafer and a white organic light-emitting diode (WOLED), and then processing a color filter (CF) on a separate glass substrate. Both the WOLED and CF achieve alignment by bonding, and then get a full-color OLED display screen.

However, such organic light-emitting display screen formed by the bonding process is prone to misalignment between the WOLED and the CF, thereby causing the abnormal display.

SUMMARY

An object of the disclosure is to solve the above problems and to provide an organic light-emitting display screen and a manufacturing method thereof.

The objective of the disclosure is achieved by adopting the following technical solutions.

An organic light-emitting display screen is provided, comprising a filter substrate, and a color filter layer, a cathode layer, an organic light-emitting layer and an anode array sequentially formed on the filter substrate, the anode array comprising a plurality of anode units spaced apart from each other, the color filter layer comprising a plurality of filter units, and each of the anode units corresponding to each of the filter units.

The organic light-emitting display screen further comprises a drive backplane, the anode array further comprises a plurality of first electrodes spaced apart from each other, the first electrode is formed on the anode unit and bonded to the drive backplane, and the anode unit is electrically connected to the drive backplane through the first electrode.

The anode array further comprises a plurality of protective units spaced apart from each other, the protective unit is formed on the anode unit, the protective unit is formed with a first through hole therein, and the first through hole is filled with the first electrode.

The organic light-emitting display screen further comprises an insulated isolation layer covering the anode units and the organic light-emitting layer between the adjacent anode units, the insulated isolation layer is formed with a second through hole therein, and the second through hole is filled with the first electrode.

The drive backplane comprises a drive substrate and a plurality of second electrodes spaced apart from each other and formed on a surface of the drive substrate, and each of the second electrodes is bonded to each of the first electrodes by an anisotropic conductive film.

A width of the second electrode is smaller than a distance between two adjacent first electrodes, and the second electrode is not simultaneously bonded to the two adjacent first electrodes.

The color filter layer further comprises a black matrix formed between the adjacent filter units.

The organic light-emitting display screen further comprises a planarization layer formed on an upper surface of the color filter layer.

The organic light-emitting display screen further comprises a water-blocking layer formed between the color filter layer and the cathode layer.

The water-blocking layer is a thin film encapsulation layer, and a material of the water-blocking layer comprises at least one of silicon oxide, silicon nitride, and silicon oxynitride.

A manufacturing method of an organic light-emitting display screen is provided, comprising:

S1, providing a filter substrate, and forming a patterned color filter layer on the filter substrate, and the color filter layer comprising a plurality of filter units having different colors;

S2, sequentially depositing a cathode layer, an organic light-emitting layer, and an anode unit material over the color filter layer;

S3, patterning the anode unit material to form a plurality of anode units spaced apart from each other, each of the anode units corresponding to each of the filter units, and the plurality of anode units forming part of the anode array.

A step S3 comprises:

S31, depositing a protective material to cover the anode unit material after depositing the anode unit material;

S32, forming a photoresist mask plate on the protective material by a photolithography patterning process;

S33, forming a plurality of protective units spaced apart from each other by etching the protective material with the photoresist mask plate as a mask, and then removing the photoresist mask plate;

S34, forming the plurality of anode units spaced apart from each other by etching the anode unit material with the plurality of protective units as a mask.

After a step S34, the method further comprises:

S35, depositing an insulated isolation layer covering the anode units and the organic light-emitting layer between the adjacent anode units;

S36, etching the insulated isolation layer and the protective unit corresponding to the anode unit, and separately forming a second through hole through the insulated isolation layer and a first through hole through the protective unit;

S37, forming over the anode units a plurality of first electrodes spaced apart from each other, and filling the second through hole and the first through hole with the first electrode to make the first electrode electrically connect to the anode unit.

The method further comprises S4: providing a drive backplane, a step S4 comprising:

S41, forming on the drive substrate a plurality of second electrodes spaced apart from each other, the second electrodes and the drive substrate constituting the drive backplane;

S42, bonding the anode array to the second electrodes with an anisotropic conductive film.

A cathode layer group comprises a water-blocking layer and a cathode layer, and a step S2 further comprises: sequentially depositing the water-blocking layer and the cathode layer over the color filter layer.

The step S2 further comprises: forming a planarization layer on an upper surface of the color filter layer.

BRIEF DESCRIPTION OF THE DRAWINGS

In order to more clearly illustrate embodiments of the disclosure or technical solutions in the prior art, a brief introduction will be made below to the drawings to be used in the description of the embodiments or the prior art. It is apparent that the drawings in the description below are merely some embodiments of the disclosure, and a person skilled in the art can obtain other drawings according to the structures shown in these drawings without paying creative work.

DETAILED DESCRIPTION OF PREFERRED EMBODIMENTS

In order to make the purposes, technical solutions and advantages of the disclosure clearer, the technical solutions of the disclosure will be clearly and completely described below with reference to the specific embodiments and the corresponding drawings. It is apparent that the described embodiments are merely part of the embodiments of the disclosure rather than all the embodiments. Based on the embodiments in the disclosure, all the other embodiments obtained by a person skilled in the art without paying creative work will fall into the protection scope of the disclosure.

The technical solutions provided by the preferred embodiments of the disclosure are described in detail below in combination with the accompanying drawings.

Figure 1:
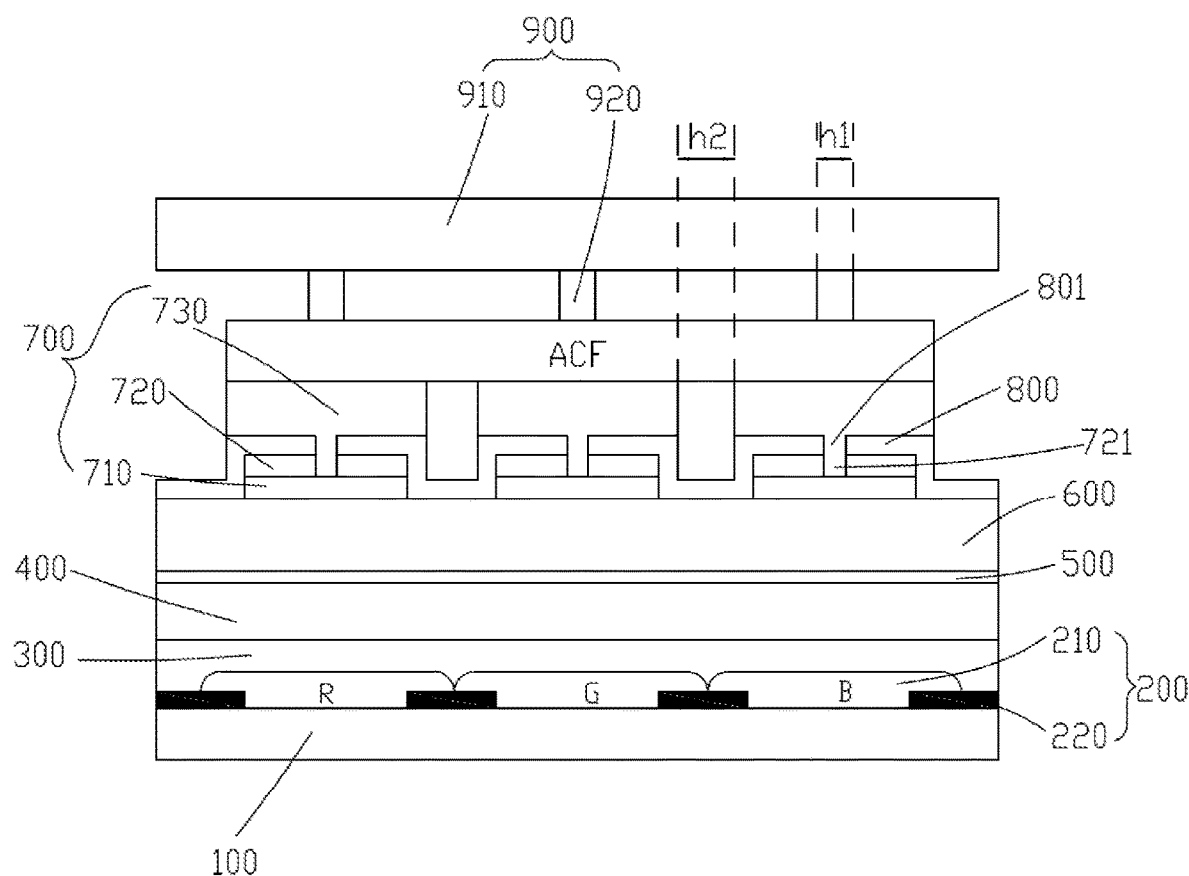
FIG. 1 is a schematic structural view of an organic light-emitting display screen provided by an embodiment of the disclosure.

As shown in FIG. 1, an embodiment provides an organic light-emitting display screen including: a filter substrate 100; a color filter layer 200, a planarization layer 300, a water-blocking layer 400, and a cathode layer 500, an organic light-emitting layer 600, an anode array 700 and insulated isolation layer 800 sequentially formed on the filter substrate 100; further including a drive backplane 900, and the anode array 700 bonded to the drive backplane 900.

The filter substrate 100 is a light transparent substrate, specifically a glass substrate, and the organic light-emitting display screen can emit light which passes through the filter substrate 100.

The color filter layer 200 includes a plurality of filter units 210 having different colors and black matrices 220 formed between the adjacent filter units 210. The filter unit 210 can precisely select a small range of wave bands within which a light wave intends to pass and reflect off other wave bands within which the light wave does not intend to pass. The filter unit 210 of the present embodiment includes a plurality of red filter units R, green filter units G, and blue filter units B spaced apart from each other. The light emitted from the organic light-emitting layer 600 passes through the red filter units R, the green filter units G, and the blue filter units B, and can then emit red light, green light, and blue light respectively, thereby realizing a color display frame. In other embodiments of the disclosure, the filter unit 210 may further include filter units having other colors, or the filter unit 210 includes only filter units having two colors, which are not limited thereto, as long as the colors of the two adjacent filter units 210 are different. The black matrix 220 is formed between the adjacent filter units 210 to prevent the light beam emitted by the organic light-emitting layer 600 corresponding to the filter unit 210 having a certain color from emitting toward the filter unit 210 having the other color adjacent to the filter units 210 having said color, thereby preventing color mixing.

The planarization layer 300 is formed between the color filter layer 200 and the cathode layer 500, specifically on an upper surface of the color filter layer 200. The cathode layer 500 above the color filter layer 200 is thin, and the surface of the color filter layer 200 is uneven. If the cathode layer 500 is directly formed on the upper surface of the color filter layer 200, the cathode layer 500 is easily broken, thereby leading to an open circuit or increased resistance of the cathode layer 500 which affects the performance of the display screen. Therefore, forming a planarization layer 300 on the upper surface of the color filter layer 200 enhances the reliability of the electrical property of the display screen. The planarization layer in the embodiment is an optically transparent adhesive, which has a role of planarization and a certain capability to block water, thereby preventing moisture from entering and eroding the cathode layer 500 and the organic light-emitting layer 600, and further improving the reliability of the electrical property of the display screen. Of course, in other embodiments, the planarization layer may also be other light-transparent materials.

The water-blocking layer 400 is also formed between the color filter layer 200 and the cathode layer 500 and is a layer of a light-transparent material. The water-blocking layer 400 in this embodiment is a thin film encapsulation layer, which may be made of materials such as silicon oxide ($SiO_x$), silicon nitride ($SiN_x$) or silicon oxynitride ($SiO_xN_y$). The water-blocking layer 400 is formed over the planarization layer 300 to further prevent moisture from entering and eroding the cathode layer 500 and the organic light-emitting layer 600, so that the electrical properties of the display screen can be more reliable. Of course, this embodiment is a preferred embodiment. In other embodiments of the disclosure, the water-blocking layer 400 may also be other light-transparent materials, or the positions of the water-blocking layer 400 and the planarization layer 300 may be interchanged, or only one of them may remain or none of them may remain, which are not limited thereto.

The cathode layer 500 is a layer of a transparent and conductive material. In order to increase the light transmittance through the cathode layer 500, the thickness of the cathode layer 500 is generally thin. Once moisture enters the cathode layer 500, the electrical properties of the cathode layer 500 are greatly influenced due to oxidation and the like. Therefore, in this embodiment, the planarization layer 300 and the water-blocking layer 400 preferably form a double water-resistant layer, thereby making the reliability of the display screen high.

In this embodiment, the white light-emitting material of the organic light-emitting layer 600 emits white light under the driving of voltage. The white light emitted from the organic light-emitting layer 600 forms light having various colors by passing through the filter units 210 having various colors, thereby realizing full-color display.

The anode array 700 includes a plurality of anode units 710 spaced apart from each other, and protective units 720 formed over the anode units 710 and first electrodes 730. Each of the anode units 710 corresponds to each of the filter units 210 and is electrically connected to the drive backplane 900. The drive backplane 900 provides a driving voltage for each anode unit 710, and each of the anode units 710 and the cathode layer 500 below the anode units 710 collectively supply a voltage to the organic light-emitting layer 600, so that electron hole pairs of the organic light-emitting layer 600 are combined to generate photons, thereby emitting light. Each of the protective units 720 is located on each of the anode units 710 for protecting the organic light-emitting layer 600 during the process of forming the anode units 710, thereby improving the performance of the display screen. The reasons for the above may see the manufacturing method of the organic light-emitting display screen described below. Of course, in other embodiments, the protective unit 720 may not be formed either. A first through hole 721 is formed in each of the protective units 720. Each of the first electrodes 730 is formed over each of the anode units 710 and bonded to the drive backplane 900. Specifically, the first electrode 730 is located on an upper surface of the protective unit 720 and fills the first through hole 721, so that the anode unit 710 under the protective unit 720 is electrically connected to the first electrode 730.

The insulated isolation layer 800 is formed on upper surfaces of the protective units 720 and covers sidewalls of the anode units 710 and the organic light-emitting layer between the adjacent anode units 710. The insulated isolation layer 800 prevents shorting between the adjacent anode units 710. Of course, the specific structure of the insulated isolation layer 800 in the other embodiments of the disclosure may also be different from that in the embodiment. For example, the insulated isolation layer 800 is only formed between the two anode units 710, and the shorting between the adjacent anode units 710 is effectively prevented as long as the insulated isolation layer 800 covers the sidewalls of the anode unit 710, thereby improving the reliability of the display screen. Alternatively, the insulated isolation layer 800 covers the upper surfaces and the sidewalls of the anode units 710 and the organic light-emitting layer between the adjacent anode units 710 when no protective unit 720 is formed. The insulated isolation layer 800 is formed with a second through hole 801, and the first electrode 730 simultaneously fills the second through hole 801 and the first through hole 721.

The drive backplane 900 includes a drive substrate 910 and a plurality of second electrodes 920 formed on a surface of the drive substrate 910 and spaced apart from each other. The drive substrate 910 includes a base (such as a Si base, not shown), and a thin film transistor (not shown) or the like formed on the base for supplying a driving voltage. The plurality of second electrodes 920 are formed on the surface of the drive substrate 910 and spaced apart from each other, and the second electrode 920 is bonded to the first electrode 730 by an anisotropic conductive film (ACF). The electrically conductive performance of Z-axis of the anisotropic conductive film is significantly different from the resistance characteristic of XY insulation planes. Therefore, the ACF can electrically connect the second electrode 920 and the first electrode 730 in the longitudinal direction such that the anode unit 710 is electrically connected to the drive backplane 910 through the first electrode 730; meanwhile, making the adjacent second electrodes 920 laterally insulated from each other and making the adjacent first electrodes 730 laterally insulated from each other realize that the driving voltage of one anode unit 710 does not affect the driving voltage of the other anode unit 710 and shorting does not occur among all of the anode units 710. At the same time, the adhesiveness of the ACF causes the second electrode 920 and the first electrode 730 to be reliably bonded together. Because alignment deviation can inevitably occur in the bonding process, in the embodiment, preferably, the width h1 of the second electrode 920 is smaller than the distance h2 between the two adjacent first electrodes 710. In case of a certain alignment deviation, the same second electrode 920 also does not simultaneously correspond to the two adjacent first electrodes 710, thereby preventing shorting from occurring between the two adjacent first electrodes 710 due to the alignment deviation. The "width" herein refers to the "width" in the h1 and h2 directions in the cross-sectional views shown in FIG. 1 and FIG. 2. Of course, in other embodiments, h1 may not be smaller than h2 as long as no shorting occurs between the two adjacent first electrodes 710.

In one embodiment, the filter unit may also be implemented as a light conversion material, which converts light outside a wavelength range to light with the wavelength range, thereby functioning as a filter to stably output the RGB light source; In other embodiments, the filter unit may also be a combination of a filter unit functioning as barrier filtration and a filter unit functioning as the light conversion.

Figure 2:
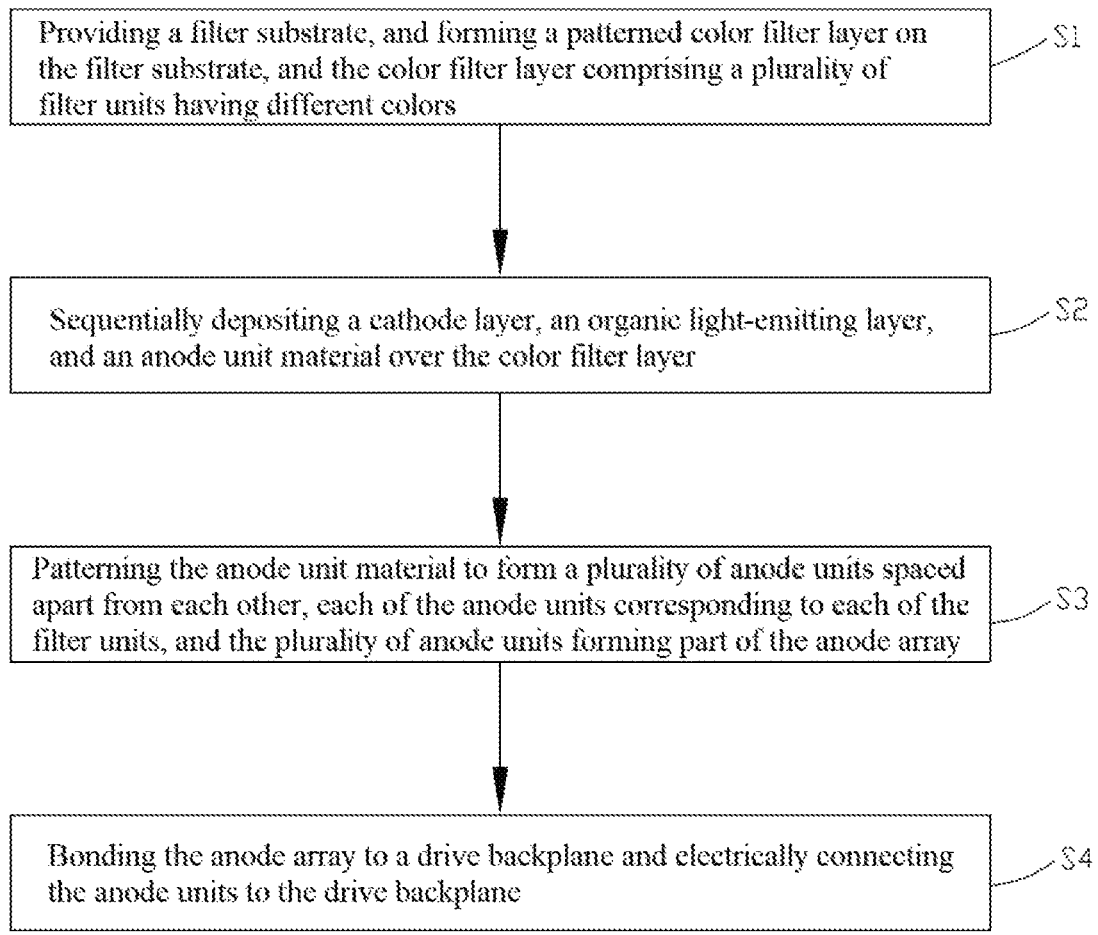
FIG. 2 is a flow chart of manufacturing an organic light-emitting display screen provided by an embodiment of the disclosure.

The embodiment also provides a manufacturing method of the above-mentioned organic light-emitting display screen, as shown in FIG. 2, including the following steps which are not limited to the following sequences, and the sequences can be adjusted according to requirements which are not described herein in detail.

Figure 4:
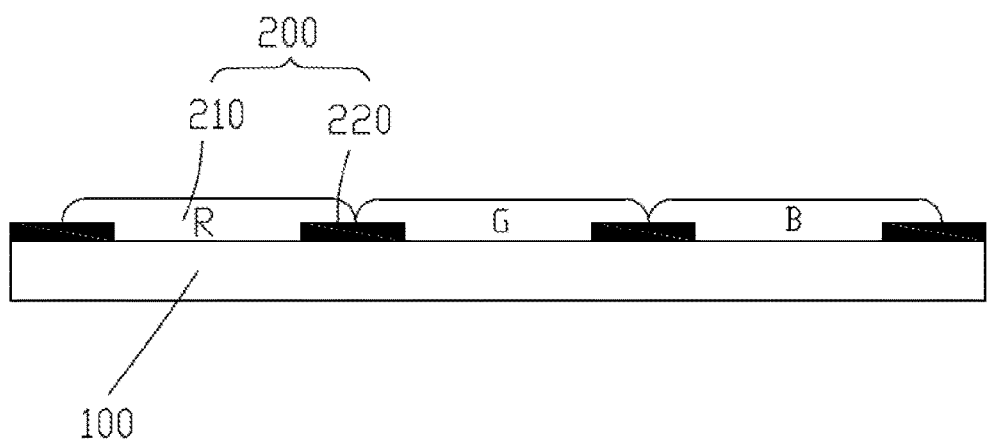
FIG. 4 is a schematic structural view of manufacturing an organic light-emitting display screen provided by an embodiment of the disclosure.

S1, providing a filter substrate 100, and forming a patterned color filter layer 200 on the filter substrate 100, the color filter layer 200 comprising a plurality of filter units 210 having different colors, as shown in FIG. 4.

A filter substrate 100, such as a glass, is provided, and a plurality of black matrices 220 are formed on the filter substrate 100 and spaced apart from each other by a photolithography patterning process, and a plurality of red filter units R, green filter units G, and blue filter units B are then sequentially formed on the black matrix 220 and on the filter substrate 100 between the black matrices 220 by a patterning process. The manufacturing process of the color filter layer 200 is a conventional technical means in the art, and will not be described herein in detail.

Figure 5:
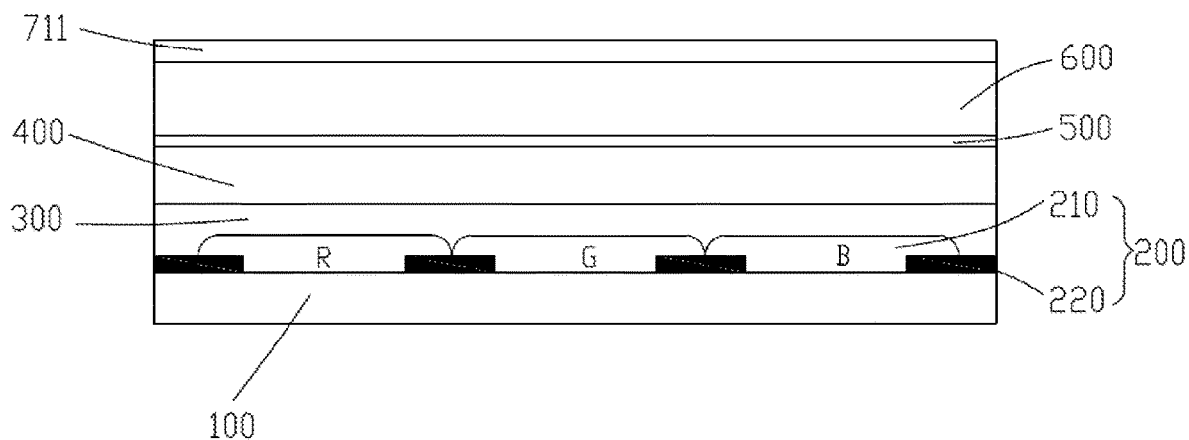
FIG. 5 is another schematic structural view of manufacturing an organic light-emitting display screen provided by an embodiment of the disclosure.

S2, sequentially depositing a cathode layer 500, an organic light-emitting layer 600, and an anode unit material 711 over the color filter layer 200, as shown in FIG. 5.

In this embodiment, a planarization layer 300 is formed over the color filter layer 200 first to enhance the reliability of electrical properties of the display screen. The planarization layer 300 in the present embodiment is an optically transparent adhesive. Of course, during the actual manufacturing process, the filter substrate 100 for forming the color filter layer 200 and the optically transparent adhesive over the color filter layer 200 can also be directly obtained by purchasing. A water-blocking layer 400 is then formed over the planarization layer 300 to further enhance the electrical reliability of the display screen. Then, a cathode layer 500, an organic light-emitting layer 600, and an anode unit material 711 are sequentially deposited on an upper surface of the water-blocking layer 400. The water-blocking layer 400 is finally deposited on the cathode layer 500, which is a conventional preparation method in the art. However, in the present embodiment, the preparation sequence can be inverted to meet the following alignment requirements, and a better packaging effect can still be achieved.

Figure 3:
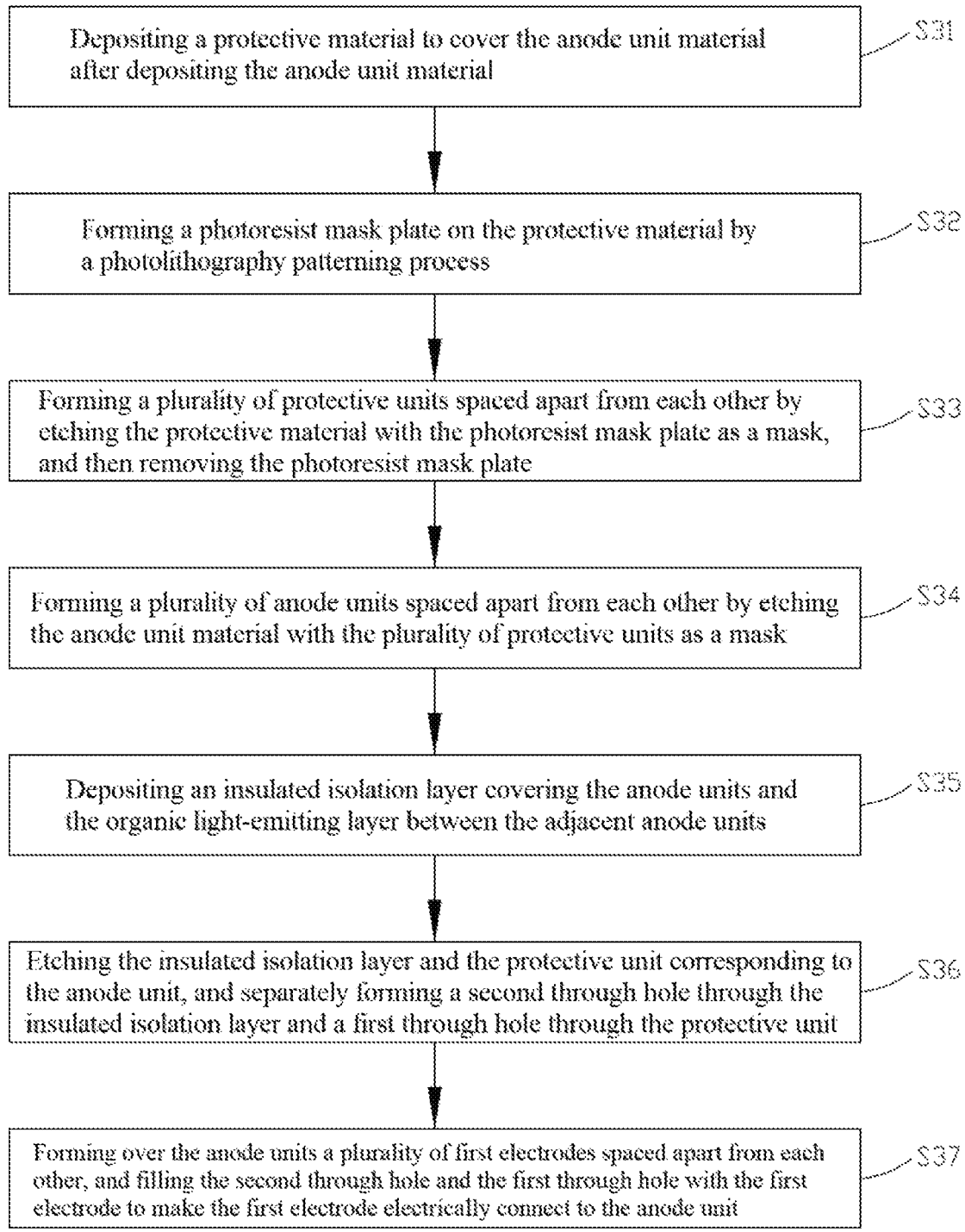
FIG. 3 is a flow chart of manufacturing an anode array of an organic light-emitting display screen provided by an embodiment of the disclosure.

S3, patterning the anode unit material 711 to form a plurality of anode units 710 spaced apart from each other, each of the anode units 710 corresponding to each of the filter units 210, and the plurality of anode units 710 forming part of the anode array 700. The entire flow chart of manufacturing the anode array 700 is shown in FIG. 3.

Figure 6:
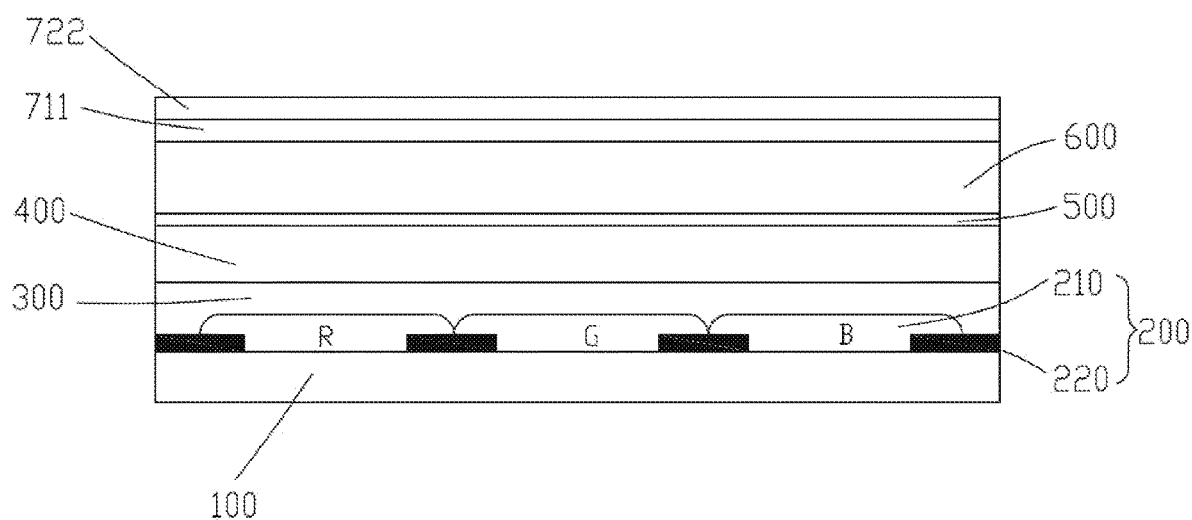
FIG. 6 is another schematic structural view of manufacturing an organic light-emitting display screen provided by an embodiment of the disclosure.

S31, depositing a protective material 722 to cover the anode unit material 711 after depositing the anode unit material 711, as shown in FIG. 6.

In this embodiment, the protective material 722 is SiO2 material. Of course, in other embodiments, the protective material 722 may also be other materials, or may not form the protective material. This embodiment is a preferred embodiment.

Figure 7:
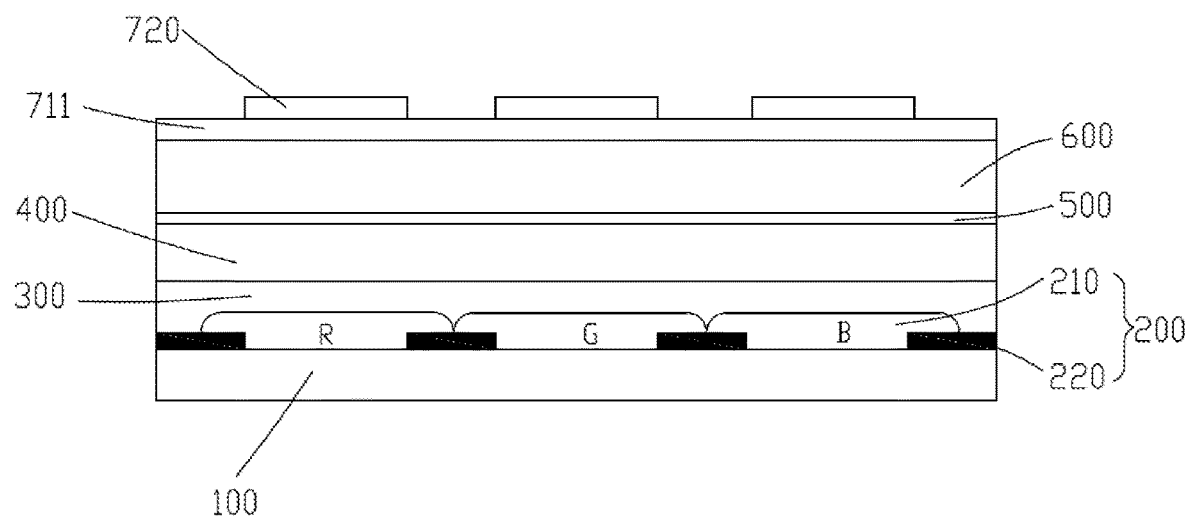
FIG. 7 is another schematic structural view of manufacturing an organic light-emitting display screen provided by an embodiment of the disclosure.

S32, forming a photoresist mask plate (not shown) on the protective material 722 by a photolithography patterning process;

S33, forming a plurality of protective units 720 spaced apart from each other by etching the protective material 722 with the photoresist mask plate as a mask, and then removing the photoresist mask plate, as shown in FIG. 7.

The protective unit 720 can be used as a mask plate for patterning the anode unit 710. After forming the protective unit 720, the photoresist mask plate is removed by a dry etching process such as plasma etching. Since oxygen is generally used in the dry etching photoresist, the immersion of oxygen into the organic light-emitting layer 600 causes the organic light-emitting layer 600 to be oxidized, thereby affecting its performance Therefore, in this embodiment, the anode unit 710 is not formed by directly patterning the photoresist mask plate, but the protective unit 720 is formed by patterning the photoresist mask plate first. At this time, the photoresist mask plate is removed and the organic light-emitting layer 600 is protected by the anode unit material 711 below the protective material 722 which has been etched off, thereby effectively preventing the oxygen from eroding the organic light-emitting layer 600 and improving the performance of the display screen. The protective material in the embodiments of the disclosure may also have a plurality of layers. For example, a layer of Al material is formed over the SiO2 material, and after etching the patterned Al material, the photoresist mask plate is removed by methods such as plasma etching. At this time, the organic light-emitting layer 600 is protected by the SiO2 material and the anode unit material 711 below the Al material which has been etched off, thereby protecting the organic light-emitting layer 600 better. The patterned Al material may be removed after patterning the SiO2 material. Of course, in other embodiments, the protective unit 720 may not be formed.

Figure 8:
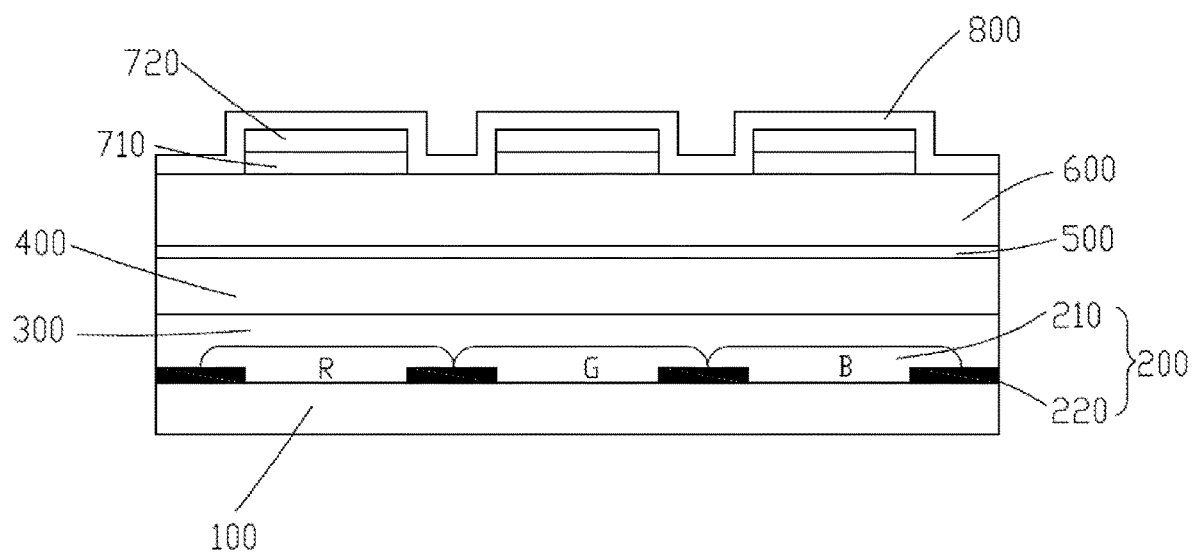
FIG. 8 is another schematic structural view of manufacturing an organic light-emitting display screen provided by an embodiment of the disclosure.

S34, forming a plurality of anode units 710 spaced apart from each other by etching the anode unit material 711 with the plurality of protective units 720 as a mask, as shown in FIG. 8.

S35, depositing an insulated isolation layer 800 covering the anode units 710 and the organic light-emitting layer between the adjacent anode units 710, as shown in FIG. 8.

Specifically, the insulated isolation layer 800 covers upper surfaces of the protective units 720, sidewalls of the anode units 710 and the organic light-emitting layer 600 between the anode units 710.

Figure 9:
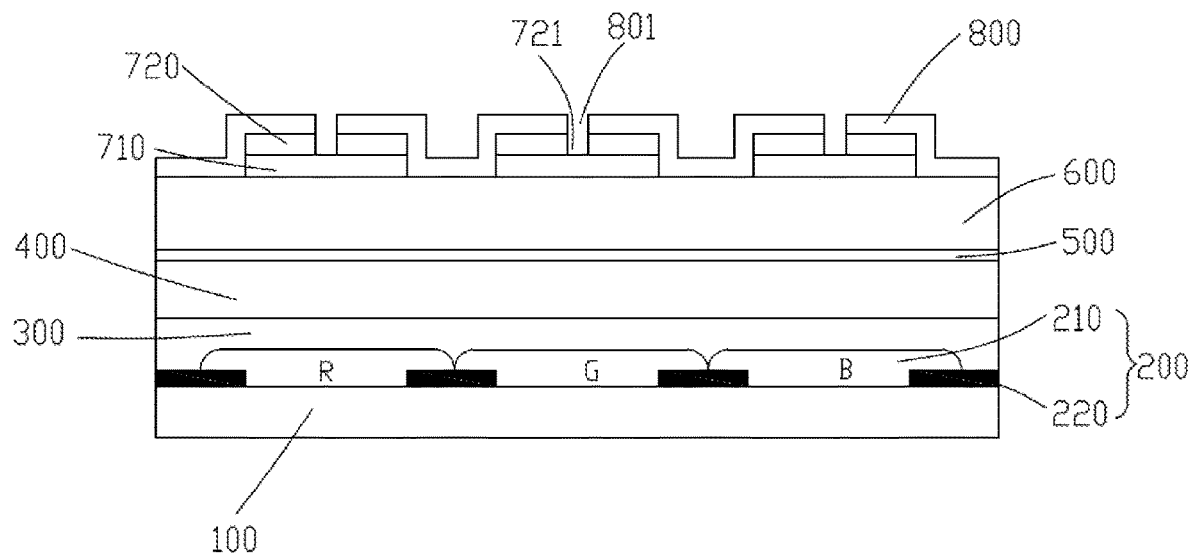
FIG. 9 is another schematic structural view of manufacturing an organic light-emitting display screen provided by an embodiment of the disclosure.

S36, etching the insulated isolation layer 800 and the protective unit 720 corresponding to each of the anode unit 710, and separately forming a second through hole 801 through the insulated isolation layer 800 and a first through hole 721 through the protective unit 720, as shown in FIG. 9.

Figure 10:
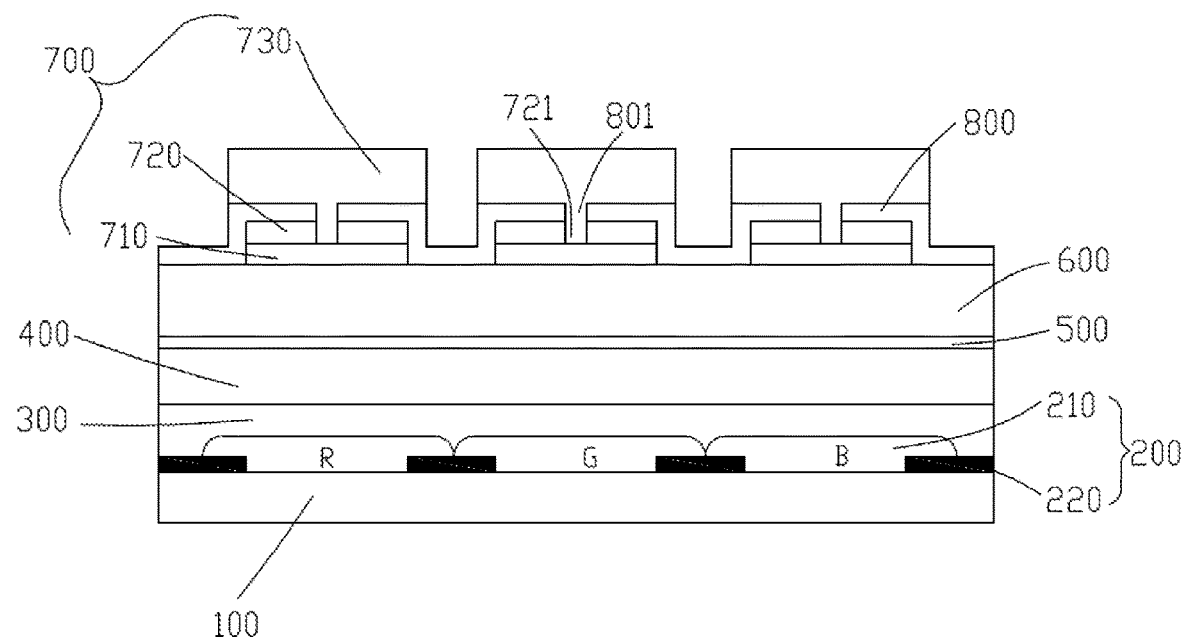
FIG. 10 is another schematic structural view of manufacturing an organic light-emitting display screen provided by an embodiment of the disclosure.

S37, forming over the anode units 710 a plurality of first electrodes 730 spaced apart from each other, and filling the second through hole 801 and the first through hole 721 with the first electrode 730 to make the first electrode 730 be electrically connected to the anode unit 710, as shown in FIG. 10.

A first electrode material is deposited to cover the insulated isolation layer 800 and fill the second through hole 801 and the first through hole 721. The first electrode material is patterned by an etching patterning process to form a first electrode 730 located over the anode unit 710. A plurality of first electrodes 730, a plurality of protective units 720, and a plurality of anode units 710 constitute the anode array 700.

S4, bonding the anode array 700 to a drive backplane 900 and electrically connecting the anode units 710 to the drive backplane 900, as shown in FIG. 1.

S41, forming on a drive substrate 910 a plurality of second electrodes 920 spaced apart from each other, the second electrodes 920 and the drive substrate 910 constituting the drive backplane 900;

S42, bonding the anode array 700 to the second electrodes 920 with an anisotropic conductive film.

Each of the first electrodes 730 above each of the anode units 710 is bonded to each of the second electrodes 920 with the anisotropic conductive film, thereby electrically connecting the anode units 710 to the drive backplane 900.

In summary, the organic light-emitting display screen and the manufacturing method thereof in the embodiment achieve the alignment between the filter unit 210 and the anode unit 710 by directly forming the anode array 700 on the color filter layer 200. Compared with the conventional bonding alignment mode, the contrast deviation of the organic light-emitting display screen formed by the embodiment is significantly reduced, thereby effectively improving the problem of the lighting crosstalk of the organic light-emitting display screen.

The objects, the technical solutions and the beneficial effects of the disclosure are further described in detail by the above specific embodiments. It is understood that the above contents are only specific embodiments of the disclosure and are not intended to limit the disclosure. Any amendments, equivalent substitutions and improvements made within the spirit and principle of the disclosure should be included in the protection scope of the disclosure.

What is claimed is:

1. An organic light-emitting display screen, comprising:
a filter substrate, and a color filter layer, a cathode layer, an organic light-emitting layer and an anode array sequentially formed on the filter substrate, the anode array comprising a plurality of anode units spaced apart from each other, the color filter layer comprising a plurality of filter units, and each of the anode units corresponding to each of the filter units, wherein the organic light-emitting display screen further comprises a drive backplane, the anode array further comprises a plurality of first electrodes spaced apart from each other, at least one first electrode of the plurality of first electrodes is formed on at least one anode unit of the plurality of anode units and bonded to the drive backplane, and the at least one anode unit of the plurality of anode units is electrically connected to the drive backplane through the at least one first electrode of the plurality of first electrodes.

2. The organic light-emitting display screen according to claim 1, wherein the anode array further comprises a plurality of protective units spaced apart from each other, at least one protective unit of the plurality of protective units is formed on the at least one anode unit of the plurality of anode units, the at least one protective unit of the plurality of protective units is formed with a first through hole therein, and the first through hole is filled with the at least one first electrode of the plurality of first electrodes.

3. The organic light-emitting display screen according to claim 1, wherein the organic light-emitting display screen further comprises an insulated isolation layer covering the plurality of anode units and the organic light-emitting layer between the adjacent anode units of the plurality of anode units, the insulated isolation layer is formed with a second through hole therein, and the second through hole is filled with the at least one first electrode of the plurality of first electrodes.

4. The organic light-emitting display screen according to claim 1, wherein the drive backplane comprises a drive substrate and a plurality of second electrodes spaced apart from each other and formed on a surface of the drive substrate, and each of the second electrodes is bonded to each of the first electrodes by an anisotropic conductive film.

5. The organic light-emitting display screen according to claim 4, wherein a width of at least one second electrode of the plurality of second electrodes is smaller than a distance between two adjacent first electrodes, and the at least one second electrode of the plurality of second electrodes is not simultaneously bonded to the two adjacent first electrodes.

6. The organic light-emitting display screen according to claim 1, wherein the color filter layer further comprises a black matrix formed between adjacent filter units of the plurality of filter units.

7. The organic light-emitting display screen according to claim 1, wherein the organic light-emitting display screen further comprises a planarization layer formed on an upper surface of the color filter layer.

8. The organic light-emitting display screen according to claim 1, wherein the organic light-emitting display screen further comprises a water-blocking layer formed between the color filter layer and the cathode layer.

9. The organic light-emitting display screen according to claim 8, wherein the water-blocking layer is a thin film encapsulation layer, and a material of the water-blocking layer comprises at least one of silicon oxide, silicon nitride, and silicon oxynitride.

10. A manufacturing method of an organic light-emitting display screen, comprising:
S1, providing a filter substrate, and forming a patterned color filter layer on the filter substrate, and the color filter layer comprising a plurality of filter units having different colors;
S2, sequentially depositing a cathode layer, an organic light-emitting layer, and an anode unit material over the color filter layer;
S3, patterning the anode unit material to form a plurality of anode units spaced apart from each other, each of the anode units corresponding to each of the filter units, and the plurality of anode units forming part of an anode array,
wherein the step S3 comprises:
S31, depositing a protective material to cover the anode unit material after depositing the anode unit material;
S32, forming a photoresist mask plate on the protective material by a photolithography patterning process;
S33, forming a plurality of protective units spaced apart from each other by etching the protective material with the photoresist mask plate as a mask, and then removing the photoresist mask plate;
S34, forming the plurality of anode units spaced apart from each other by etching the anode unit material with the plurality of protective units as a mask.

11. The manufacturing method of the organic light-emitting display screen according to claim 10, wherein after a step S34, the method further comprises:
S35, depositing an insulated isolation layer covering the anode units and the organic light-emitting layer between the adjacent anode units;
S36, etching the insulated isolation layer and the protective unit corresponding to the anode unit, and separately forming a second through hole through the insulated isolation layer and a first through hole through the protective unit;
S37, forming over the anode units a plurality of first electrodes spaced apart from each other, and filling the second through hole and the first through hole with the first electrode to make the first electrode electrically connect to the anode unit.

12. The manufacturing method of the organic light-emitting display screen according to claim 10, wherein the method further comprises S4: providing a drive backplane, the step S4 comprising:
S41, forming on a drive substrate a plurality of second electrodes spaced apart from each other, the second electrodes and the drive substrate constituting the drive backplane;
S42, bonding the anode array to the second electrodes with an anisotropic conductive film.

13. The manufacturing method of the organic light-emitting display screen according to claim 10, wherein a cathode layer group comprises a water-blocking layer and a cathode layer, and the step S2 further comprises: sequentially depositing the water-blocking layer and the cathode layer over the color filter layer.

14. The manufacturing method of the organic light-emitting display screen according to claim 13, wherein the step S2 further comprises: forming a planarization layer on an upper surface of the color filter layer.

15. A manufacturing method of an organic light-emitting display screen, comprising:
S1, providing a filter substrate, and forming a patterned color filter layer on the filter substrate, and the color filter layer comprising a plurality of filter units having different colors;
S2, sequentially depositing a cathode layer, an organic light-emitting layer, and an anode unit material over the color filter layer;
S3, patterning the anode unit material to form a plurality of anode units spaced apart from each other, each of the anode units corresponding to each of the filter units, and the plurality of anode units forming part of the anode array, wherein the method further comprises S4: providing a drive backplane, the step S4 comprising:

S41, forming on a drive substrate a plurality of second electrodes spaced apart from each other, the second electrodes and the drive substrate constituting the drive backplane;

S42, bonding the anode array to the second electrodes with an anisotropic conductive film.

* * * * *